US012805140B2

(12) United States Patent
Jeong et al.

(10) Patent No.: US 12,805,140 B2
(45) Date of Patent: Nov. 17, 2026

(54) DISPLAY PANEL AND DISPLAY DEVICE

(71) Applicant: LG Display Co., Ltd., Seoul (KR)

(72) Inventors: Jongho Jeong, Paju-si (KR); MinChul Byun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 432 days.

(21) Appl. No.: 18/396,663

(22) Filed: Dec. 26, 2023

(65) Prior Publication Data

US 2024/0224683 A1 Jul. 4, 2024

(30) Foreign Application Priority Data

Dec. 30, 2022 (KR) ........................ 10-2022-0190500

(51) Int. Cl.

| | |
|---|---|
| ***H10K 59/35*** | (2023.01) |
| ***G09G 3/32*** | (2016.01) |
| ***G09G 3/3233*** | (2016.01) |
| ***H10K 59/32*** | (2023.01) |

(52) U.S. Cl.

CPC ............. *H10K 59/351* (2023.02); *G09G 3/32* (2013.01); *G09G 3/3233* (2013.01); *H10K 59/32* (2023.02); *H10K 59/353* (2023.02); *G09G 2300/0426* (2013.01); *G09G 2300/0452* (2013.01)

(58) Field of Classification Search

CPC ..... H10K 59/351; H10K 59/35; G09G 3/2074

See application file for complete search history.

(56) References Cited

U.S. PATENT DOCUMENTS

| | | | | |
|---|---|---|---|---|
| 10,535,291 | B2 * | 1/2020 | Zhang | G09G 3/2003 |
| 2010/0141693 | A1 | 6/2010 | Lee et al. | |
| 2015/0213748 | A1 | 7/2015 | Park et al. | |
| 2018/0357966 | A1 * | 12/2018 | Ma | G09G 3/3233 |
| 2021/0134926 | A1 | 5/2021 | Song | |
| 2022/0208916 | A1 | 6/2022 | Kim et al. | |
| 2022/0209068 | A1 * | 6/2022 | So | H01Q 1/364 |

FOREIGN PATENT DOCUMENTS

| | | | |
|---|---|---|---|
| KR | 10-2008-0095810 | A | 10/2008 |
| KR | 10-2015-0089308 | A | 8/2015 |
| KR | 10-2021-0053541 | A | 5/2021 |
| KR | 10-2022-0092113 | A | 7/2022 |

* cited by examiner

*Primary Examiner* — Mohammad A Rahman

(74) *Attorney, Agent, or Firm* — Seed Intellectual Property Law Group LLP

(57) ABSTRACT

The present disclosure provides a display device that includes a transmissive area, and a non-transmissive area disposed on at least one side of the transmissive area, and including a first subpixel pair, a second subpixel pair, and a third subpixel pair. Each of the first subpixel pair, the second subpixel pair, and the third subpixel pair may include two or more subpixels having a complementary color relationship, and data voltages may be supplied to the subpixels having the complementary color relationship at a same scan timing, thereby, enabling operation with low power.

21 Claims, 15 Drawing Sheets

DISPLAY PANEL AND DISPLAY DEVICE

CROSS-REFERENCE TO RELATED APPLICATION

This application claims the priority benefit of Republic of Korea Patent Application No. 10-2022-0190500, filed on Dec. 30, 2022 in the Korean Intellectual Property Office, which is incorporated herein by reference in its entirety.

BACKGROUND

Technical Field

The present disclosure relates to electronic devices with displays, and more specifically, to a display panel and a display device.

Description of the Related Art

As display technology advances, display devices having various capabilities and functions such as transparent display devices configured to enable an image or information and a lower portion of, or a portion under, a display panel to be viewed together from the front of the display panel have been developed and utilized.

Transmittance and light emitting area are often considerations so that such display devices can perform display capability effectively and efficiently. It would be therefore desired to improve transmittance and employ a structure capable of increasing the area of a light emitting area for an enhanced light emitting performance.

BRIEF SUMMARY

One or more embodiments of the present disclosure may provide a display panel and a display device that, since each light emitting area is designed to have a wide area in the display panel including a transparent area, enable high luminance to be implemented even under low current density, and thereby, enable the lifespan of light emitting elements to be extended, and in turn, are capable of operating with low power.

One or more embodiments of the present disclosure may provide a display panel and a display device that are capable of preventing resolution reduction while facilitating expression of an achromatic color by employing a structure in which each of a plurality of subpixel pairs includes respective light emitting areas configured to emit light of a complementary color pair.

One or more embodiments of the present disclosure may provide a display panel and a display device that include a structure in which one transmissive area has an area corresponding to one subpixel or two subpixels, and thereby, are capable of improving transmittance, and facilitating recognition of a lower portion of, or a portion under, the display panel from the front of the display panel.

One or more embodiments of the present disclosure may provide a display panel and a display device that include a structure in which respective circuits of subpixels disposed in the same row are electrically connected to a same scan line, and at least two of subpixels disposed in the same column are electrically connected to a same data line, and thereby, are capable of simplifying a corresponding manufacturing process and reducing an opaque area occupied by a plurality of signal lines.

According to aspects of the present disclosure, a display device can be provided that includes: at least one transmissive area; and a non-transmissive area disposed on at least one side of the at least one transmissive area, and including first, second, and third subpixel pairs. Each of the first, second, and third subpixel pairs may include two or more subpixels having a complementary color relationship among a plurality of subpixels, and data voltages may be supplied to the subpixels having the complementary color relationship at a same scan timing.

According to aspects of the present disclosure, a display panel can be provided that includes: at least one transmissive area; and a non-transmissive area disposed on at least one side of the at least one transmissive area, and including a first subpixel disposed between at least two transmissive areas among the at least one transmissive area, and first, second, and third subpixel pairs, which include a plurality of subpixels. Each of the first, second, and third subpixel pairs may include two light emitting areas stacked in the vertical direction, and the light emitting areas included in each of the first, second, and third subpixel pairs may emit respective light of complementary color pairs.

According to one or more embodiments of the present disclosure, a display panel and a display device may be provided that, since each light emitting area is designed to have a wide area in the display panel including a transparent area, enable high luminance to be implemented even under low current density, and thereby, enable the lifespan of light emitting elements to be extended, and in turn, are capable of operating with low power.

According to one or more embodiments of the present disclosure, a display panel and a display device may be provided that are capable of preventing resolution reduction while facilitating expression of an achromatic color by employing a structure in which each of a plurality of subpixel pairs includes respective light emitting areas configured to emit light of a complementary color pair.

According to one or more embodiments of the present disclosure, a display panel and a display device may be provided that include a structure in which one transmissive area has an area corresponding to one subpixel or two subpixels, and thereby, are capable of improving transmittance, and facilitating recognition of a lower portion of, or a portion under, the display panel from the front of the display panel.

According to one or more embodiments of the present disclosure, a display panel and a display device may be provided that include a structure in which respective circuits of subpixels disposed in the same row are electrically connected to a same scan line, and at least two of subpixels disposed in the same column are electrically connected to a same data line, and thereby, are capable of simplifying a corresponding manufacturing process and reducing an opaque area occupied by a plurality of signal lines.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1:
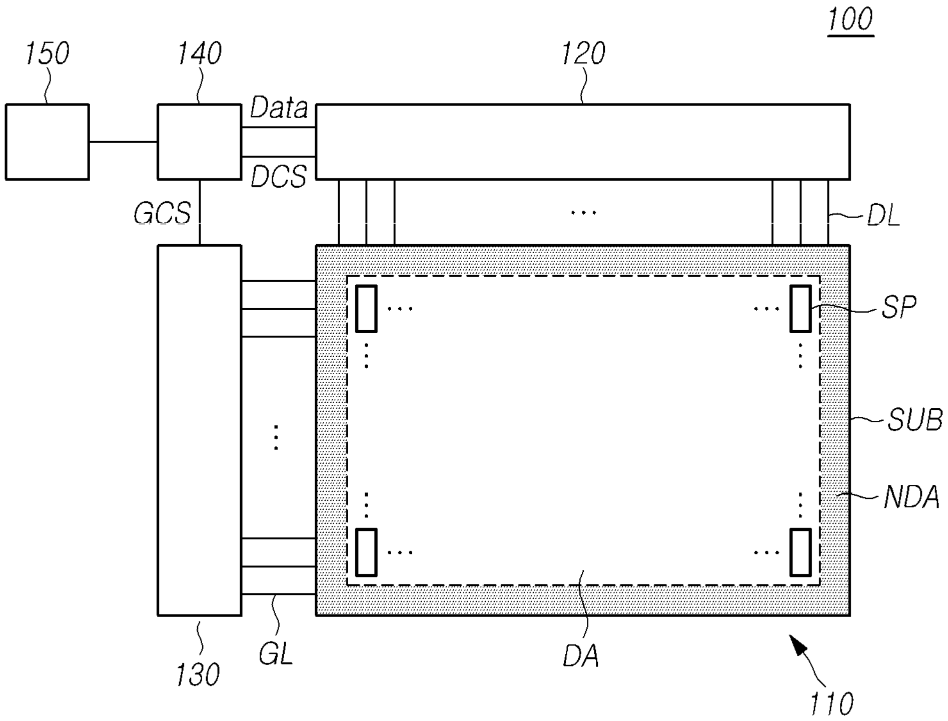
FIG. 1 illustrates an example system configuration of a display device according to aspects of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure includes claims and their equivalents. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

FIG. 1 illustrates an example system configuration of a display device 100 according to aspects of the present disclosure. With reference to FIG. 1, in one or more embodiments, a display driving system of the display device 100 according to aspects of the present disclosure may include a display panel 110 and a display driving circuit for driving the display panel 110.

The display panel 110 may include a display area DA in which an image is displayed and a non-display area NDA in which an image is not displayed. To display an image, the display panel 110 may include a plurality of subpixels SP disposed on a substrate SUB. For example, the plurality of subpixels SP may be disposed in the display area DA. In one or more embodiments, at least one subpixel SP may be disposed in the non-display area NDA. The at least one subpixel SP disposed in the non-display area NDA may be referred to as a dummy subpixel.

The display panel 110 may include various types of signal lines disposed on the substrate SUB to drive the plurality of subpixels SP. For example, the various types of signal lines may include data lines, gate lines, driving voltage lines, and the like.

The plurality of data lines and the plurality of gate lines may overlap each other. Each of the plurality of data lines may be disposed such that it extends in a first direction. Each of the plurality of gate lines may be disposed such that it extends in a second direction transverse the first direction. For example, the first direction may be a column direction, and the second direction may be a row direction.

In one or more aspects, the display device 100 may be a self-emissive display device such as an organic light emitting diode (OLED) display device, a quantum dot (QD) display device, an inorganic light emitting diode display device, and the like. For example, the display device 100 according to aspects of the present disclosure may be an organic light emitting display device implemented with organic light emitting diodes (OLED) as light emitting elements. In another example, the display device 100 according to aspects of the present disclosure may be an inorganic light emitting display device implemented with inorganic material-based light emitting diodes as light emitting elements. In further another example, the display device 100 according to aspects of the present disclosure may be a quantum dot (QD) display device implemented with quantum dots as light emitting elements, which are self-emissive semiconductor crystals.

Figure 2:
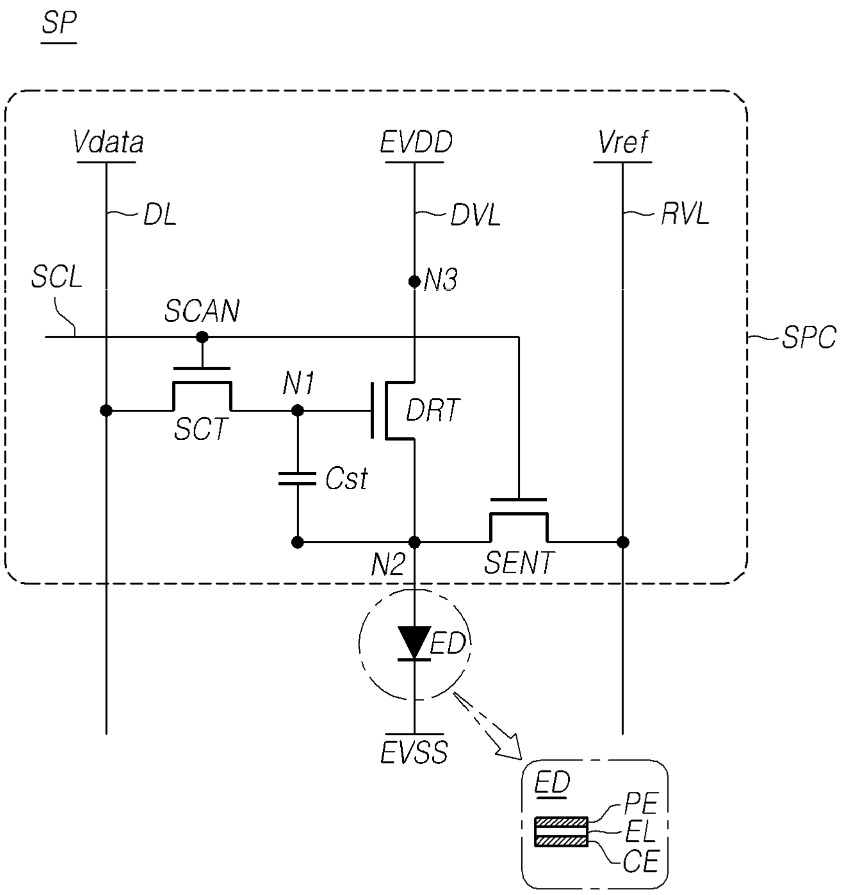
FIG. 2 illustrates an example equivalent circuit of a subpixel included in the display device according to aspects of the present disclosure.

FIG. 2 illustrates an example equivalent circuit of a subpixel SP included in the display device 100 according to aspects of the present disclosure. With reference to FIG. 2, in one or more embodiments, each subpixel SP disposed in the display device 100 according to aspects of the present disclosure may include a light emitting element ED, and a pixel driving circuit SPC configured to drive the light emitting element ED. The pixel driving circuit SPC may include a driving transistor DRT, a scan transistor SCT, and a storage capacitor Cst.

The driving transistor DRT can drive the light emitting element ED by controlling a current flowing to the light emitting element ED. The scan transistor SCT can transfer a data voltage Vdata to a first node N1, which is the gate node of the driving transistor DRT. The storage capacitor Cst may be configured to maintain a voltage for a certain period of time.

The light emitting element ED may include a pixel electrode PE and a common electrode CE, and an emission layer EL interposed between the pixel electrode PE and the common electrode CE. The pixel electrode PE may be an anode electrode (or a cathode electrode) and may be electrically connected to a second node N2 of the driving transistor DRT. The common electrode CE may be the cathode electrode (or the anode electrode), and a base voltage EVSS may be applied to the common electrode CE. The light emitting element ED may be, for example, an organic light emitting diode (OLED), a light emitting diode (LED) based on an inorganic material, a quantum dot (QD) light emitting element, a micro light emitting diode, or the like.

The driving transistor DRT may be a transistor for driving the light emitting element ED, and include the first node N1, the second node N2, and a third node N3. The first node N1 of the driving transistor DRT may be the gate node, and be electrically connected to the source node or the drain node of the scan transistor SCT. The second node N2 of the driving transistor DRT may be the source node or the drain node, and be electrically connected to the pixel electrode PE of the light emitting element ED. The third node N3 of the driving transistor DRT may be the drain node or the source node, and may be electrically connected to a driving voltage line DVL for transmitting a driving voltage EVDD. For convenience of description, descriptions that follow will be provided based on examples where the first, second and third nodes (N1, N2 and N3) of the driving transistor DRT are gate, source and drain nodes, respectively, unless explicitly stated otherwise. However, it should be understood that the scope of the present disclosure includes examples where the first, second and third nodes (N1, N2 and N3) of the driving transistor DRT are gate, drain and source nodes, respectively.

The scan transistor SCT can switch a connection between a data line DL and the first node N1 of the driving transistor DRT. The scan transistor SCT can control a connection between the first node N1 of the driving transistor DRT and a corresponding one of a plurality of data lines in response to a scan signal SCAN delivered through a scan line SCL, which is a type of gate line GL, The drain node or the source node of the scan transistor SCT may be electrically connected to the corresponding data line DL. The source node or the drain node of the scan transistor SCT may be electrically connected to the first node N1 of the driving transistor DRT. The gate node of the scan transistor SCT may be electrically connected to the scan line SCL, and can receive the scan signal SCAN through the scan line SCL. The scan transistor SCT can be turned on by the scan signal SCAN of a turn-on level voltage, and transfer a data voltage Vdata transmitted through the corresponding data line DL to the first node N1 of the driving transistor DRT.

The storage capacitor Cst may be connected or formed between the first node N1 and the second node N2 of the driving transistor DRT.

With reference to FIG. 2, in one or more embodiments, a respective pixel driving circuit SPC of each subpixel SP included in the display device 100 according to aspects of the present disclosure may further include a sensing transistor SENT. The sensing transistor SENT can switch a connection between the second node N2 of the driving transistor DRT and a reference voltage line RVL through which a reference voltage Vref is transmitted.

The sensing transistor SENT can control a connection between the second node N2 of the driving transistor DRT electrically connected to the pixel electrode PE of the light emitting element ED and a corresponding one of a plurality of reference voltage lines RVL in response to the scan signal SCAN delivered through the scan line SCL. Although FIG. 2 illustrate that the gate node of the sensing transistor SENT and the gate node of the scan transistor SCT are connected to the same scan line SCL, but embodiments of the present disclosure are not limited thereto. For example, the gate node of the sensing transistor SENT and the gate node of the scan transistor SCT may be connected to respective scan lines SCL.

The drain node or the source node of the sensing transistor SENT may be electrically connected to the corresponding reference voltage lines RVL. The source node or the drain node of the sensing transistor SENT may be electrically connected to the second node N2 of the driving transistor DRT, and be electrically connected to the pixel electrode PE of the light emitting element ED. The gate node of the sensing transistor SENT may be electrically connected to the scan line SCL, and can receive the scan signal SCAN through the scan line SCL.

The structure of the subpixel SP illustrated in FIG. 2 (which may be referred to as a 3T (three transistors)-1C(one capacitor)) structure) is merely an example for description. In one or more embodiments, a subpixel SP included in the display device 100 may include two transistors and one capacitor, or further include one or more transistors and/or one or more capacitors in the 3T-1C structure. In one or more embodiments, subpixels SP included in the display device 100 may have the same structure, or at least one of the subpixels SP may have a different structure.

Hereinafter, an example structure of the display panel 110 according to aspects of the present disclosure will be discussed.

Figure 3:
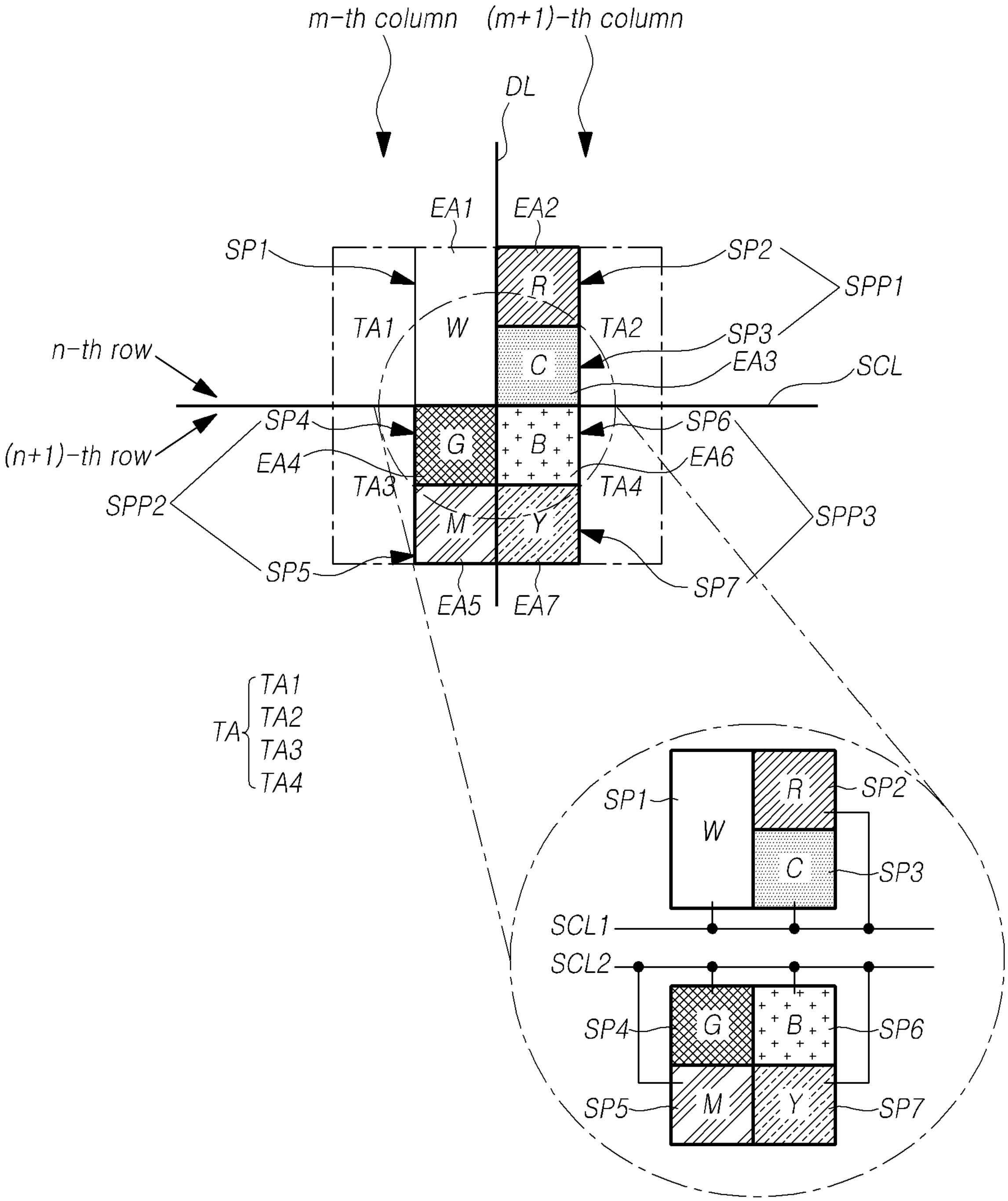
FIG. 3 schematically illustrates an example planar structure in a display area of a display panel according to aspects of the present disclosure.
Figure 4:
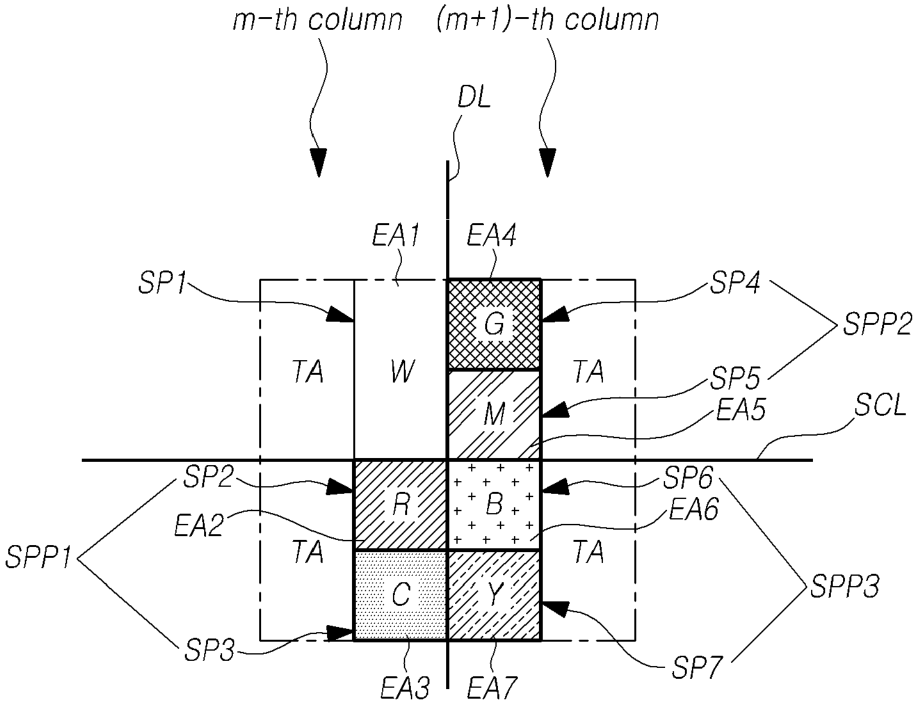
FIGS. 4 and 5 schematically illustrate other example structures in the display area of the display panel according to aspects of the present disclosure.
Figure 5:
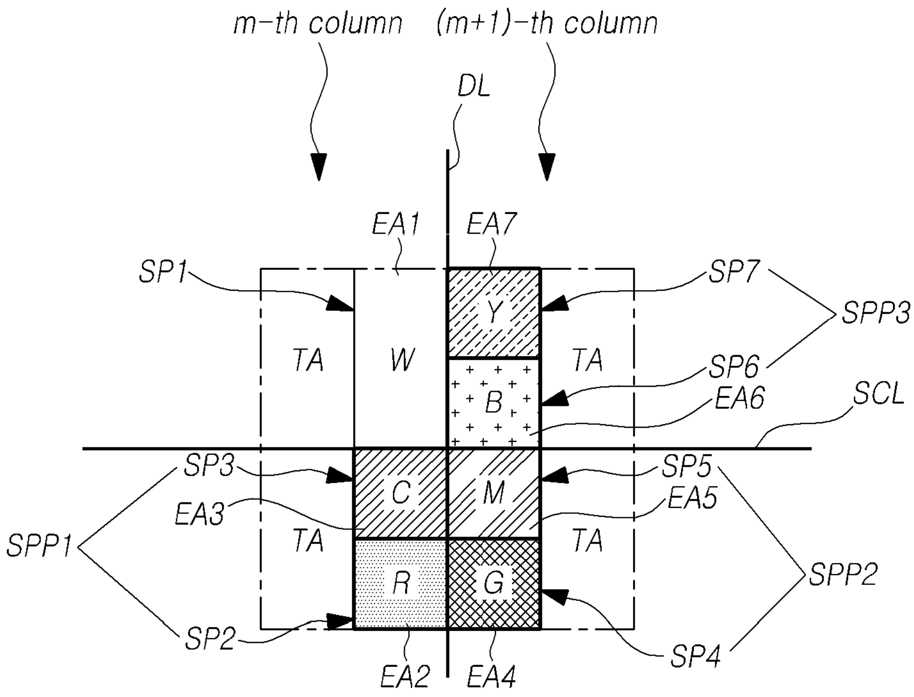

FIG. 3 schematically illustrates an example planar structure in a display area of the display panel 110 according to aspects of the present disclosure. FIGS. 4 and 5 schematically illustrate other example structures in the display area of the display panel 110 according to aspects of the present disclosure.

With reference to FIG. 3, in one or more embodiments, the display panel 110 according to aspects of the present disclosure may include at least one transmissive area TA and a non-transmissive area disposed in the display area DA.

The transmissive area TA may have a transmittance equal to or greater than a predetermined or selected transmittance, and may also be referred to as a transparent area. The transmissive area TA may be an area configured to allow external light to be transmitted, and thereby allow a lower portion of, or a portion under, the display panel 110 to be viewed from the front of the display panel 110.

The non-transmissive area may include a plurality of subpixel pairs (SPP1, SPP2, and SPP3).

Each or at least one of the plurality of subpixel pairs (SPP1, SPP2, and SPP3) may include a plurality of subpixels. The plurality of subpixels included in one subpixel pair (SPP1, SPP2, or SPP3) may have a complementary color relationship.

In one or more embodiments, the non-transmissive area may be an area where subpixels (SP1, SP2, SP3, SP4, SP5, SP6, and/or SP7) are disposed, be light emitting areas (EA1, EA2, EA3, EA4, EA5, EA6, and/or EA7) of the subpixels (SP1, SP2, SP3, SP4, SP5, SP6, and/or SP7), or be an area where pixel driving circuits SPC of the subpixels (SP1, SP2, SP3, SP4, SP5, SP6, and/or SP7) are disposed.

For example, seven subpixels (SP1, SP2, SP3, SP4, SP5, SP6, and SP7) may be arranged in two columns, and transmissive areas TA may be arranged on both sides of the seven subpixels (SP1, SP2, SP3, SP4, SP5, SP6, and SP7). The transmissive areas TA may be disposed in a non-light emitting area.

With reference to FIG. 3, a first transmissive area TA1, a first subpixel SP1, a second subpixel SP2, a third subpixel SP3, and a second transmissive area TA2 may be disposed in an n-th row (where n is a natural number greater than or equal to 1).

A third transmissive area TA3, a fourth subpixel SP4, a fifth subpixel SP5, a sixth subpixel SP6, a seventh subpixel SP7, and a fourth transmissive area TA4 may be disposed in an (n+1)-th row.

With reference to FIG. 3, the first transmissive area TA1, the first subpixel SP1, the third transmissive area TA3, the fourth subpixel SP4, and the fifth subpixel SP5 may be disposed in a m-th column (where m is a natural number greater than or equal to 1).

The second transmissive area TA2, the second subpixel SP2, the third subpixel SP3, the fourth transmissive area TA4, the sixth subpixel SP6, and the seventh subpixel SP7 may be disposed in a (m+1)-th column.

With reference to FIG. 3, one transmissive area TA (i.e., the first transmissive area TA1) may be disposed on one side of the first subpixel SP1. The second and third subpixels (SP2 and SP3) may be disposed on an opposing side of the first subpixel SP1, and one transmissive area (i.e., the second transmissive area TA2) may be disposed on one side of the second and third subpixels (SP2 and SP3).

With reference to FIG. 3, the fourth subpixel SP4 and the fifth subpixel SP5 may be disposed under the first subpixel SP1. The third transmissive area TA3 may be disposed on one side of the fourth and fifth subpixels (SP4 and SP5).

The sixth and seventh subpixels (SP6 and SP7) may be disposed on an opposing side of the fourth and fifth subpixels (SP4 and SP5). For example, the sixth subpixel SP6 may be disposed on the opposing side of the fourth subpixel SP4, and the seventh subpixel SP7 may be disposed on the opposing side of the fifth subpixel SP5.

Referring to FIG. 3, each subpixel may include one light emitting area.

For example, the first subpixel SP1, the second subpixel SP2, the third subpixel SP3, and the fourth subpixel SP4 may include a first light emitting area EA1, a second light emitting area EA2, a third light emitting area EA3, and a fourth light emitting area EA4, respectively. The fifth subpixel SP5, the sixth subpixel SP6, and the seventh subpixel SP7 may include a fifth light emitting area EA5, a sixth light emitting area EA6, and a seventh light emitting area EA7, respectively.

Each of the first to seventh light emitting areas (EA1, EA2, EA3, EA4, EA5, EA6, and EA7) may emit light of a color different from one another.

For example, the first light emitting area EA1 may be an area configured to emit white light, the second light emitting area EA2 may be an area configured to emit red light, and the third light emitting area EA3 may be an area configured to emit cyan light. In addition, the fourth light emitting area EA4 may be an area configured to emit green light, the fifth light emitting area EA5 may be an area configured to emit magenta light, the sixth light emitting area EA6 may be an area configured to emit blue light, and the seventh light emitting area EA7 may be an area configured to emit yellow light.

An area of at least one light emitting area among the first to seventh light emitting areas (EA1, EA2, EA3, EA4, EA5, EA6, and EA7) may be different from an area of each, or one or more, of the remaining light emitting areas.

For example, in FIG. 3, the area of the first light emitting area EA1 may be greater than the respective areas of the second to seventh light emitting areas (EA2, EA3, EA4, EA5, EA6, and EA7). The area of the first light emitting area EA1 may be equal to the sum of the respective areas of two of the second to seventh light emitting areas (EA2, EA3, EA4, EA5, EA6, and EA7), but this is only an example. The structures of the light emitting areas according to embodiments of the present disclosure are not limited thereto.

With reference to FIG. 3, in one or more embodiments, the display panel 110 according to aspects of the present disclosure may have a structure in which one light emitting area or two light emitting areas are located on one side of one transmissive area TA.

By employing such a configuration, the area of each light emitting area EA in the display panel 110 according to aspects of the present disclosure may be greater than that of each light emitting area EA in a typical display panel in which three or more light emitting areas are disposed on one side of one transmissive area TA.

Since each light emitting area of the display panel 110 according to aspects of the present disclosure is configured to have a greater area, the display panel 110 can be capable of representing high luminance at a low current density, and thus, the lifespan of light emitting elements included in the display panel 110 can be extended.

With reference to FIG. 3, in one or more embodiments, in the display panel 110 according to aspects of the present disclosure, the remaining subpixels except for the first subpixel SP1 including the first light emitting area EA1 may be configured such that a respective pair may be formed in every two subpixels among the remaining subpixels.

For example, the subpixels shown in FIG. 3 may be configured such that a first subpixel pair SPP1 includes the second subpixel SP2 and the third subpixel SP3, a second subpixel pair SPP2 includes the fourth subpixel SP4 and the fifth subpixel SP5, and a third subpixel pair SPP3 includes the sixth subpixel SP6 and the seventh subpixel SP7.

The first subpixel pair SPP1 may include the second light emitting area EA2 and the third light emitting area EA3 disposed in the same column.

The second subpixel pair SPP2 may include the fourth light emitting area EA4 and the fifth light emitting area EA5 disposed in the same column.

The third subpixel pair SPP3 may include the sixth light emitting area EA6 and the seventh light emitting area EA7 disposed in the same column.

Each of the first to third subpixel pairs (SPP1, SPP2, and SPP3) may include a plurality of light emitting areas. The respective areas of the light emitting areas included in each of the first to third subpixel pairs (SPP1, SPP2, and SPP3) may substantially correspond to the area of the light emitting area EA1 of the first subpixel SP1. For example, the first light emitting area EA1 may be a white light emitting area.

In one or more embodiments, with reference to FIGS. 3, 4, and 5, each of the first subpixel pair SPP1, the second subpixel pair SPP2, and the third subpixel pair SPP3 may include light emitting areas of different colors, and may including one of a red light emitting area (e.g., EA2), a green light emitting area (e.g., EA4), and a blue light emitting area (e.g., EA6).

For example, as shown in FIGS. 3, 4, and 5, the first subpixel pair SPP1 may include the red light emitting area (i.e., the second light emitting area EA2), the second subpixel pair SPP2 may include the green light emitting area (i.e., the fourth light emitting area EA4), and the third subpixel pair SPP3 may include the blue light emitting area (i.e., the sixth light emitting area EA6).

In one or more embodiments, with reference to FIGS. 3, 4, and 5, each of the first subpixel pair SPP1, the second subpixel pair SPP2, and the third subpixel pair SPP3 may include one of light emitting areas emitting respective complementary colors of red, green, and blue, while including the light emitting areas of different colors.

For example, as shown in FIGS. 3, 4, and 5, the first subpixel pair SPP1 may include a cyan light emitting area (i.e., the third light emitting area EA3), which is a light emitting area of the complementary color of red, the second subpixel pair SPP2 may include a magenta light emitting area (i.e., the fifth light emitting area EA5), which is a light emitting area of the complementary color of green, and the third subpixel pair SPP3 may include a yellow light emitting area (i.e., the seventh light emitting area EA7), which is a light emitting area of the complementary color of blue.

In this manner, two light emitting areas included in each of the subpixel pairs (SPP1, SPP2, and SPP3) may be light emitting areas configured to emit light of a complementary color pair.

Hereinafter, respective subpixels including light emitting areas, which have a complementary color relationship between them, may be referred to as a subpixel pair, as one unit.

With reference to FIG. 3, data voltages may be supplied to light emitting areas configured to emit light of a complementary color pair at a same scan timing.

Referring to FIG. 3, the second and third subpixels (SP2 and SP3) may include light emitting areas configured to emit light of a complementary color pair, and the second and third subpixels (SP2 and SP3) may be electrically connected to a same scan line, for example, a first scan line SCL1.

The fourth and fifth subpixels (SP4 and SP5) may include light emitting areas configured to emit light of a complementary color pair, and the fourth and fifth subpixels (SP4 and SP5) may be electrically connected to a same scan line, for example, a second scan line SCL2.

The sixth and seventh subpixels (SP6 and SP7) may include light emitting areas configured to emit light of a complementary color pair, and the sixth and seventh subpixels (SP6 and SP7) may be electrically connected to a same scan line, for example, the second scan line SCL2.

A structure in which each subpixel is connected to a scan line and a data line will be discussed below in more detail with reference to FIG. 6.

FIG. 3 illustrates the structure in which the first subpixel SP1 and the first subpixel pair SPP1 are disposed adjacent to each other and disposed in the same row (i.e., the n-th row), and the second subpixel pair SPP2 and the third subpixel pair SPP3 are disposed adjacent to each other and disposed in the same row (i.e., the (n+1)-th row), but structures according to embodiments of the present disclosure are not limited thereto.

For example, as shown in FIG. 4, the first subpixel SP1 and the second subpixel pair SPP2 may be disposed adjacent to each other and disposed in the same row (i.e., the n-th row), and the first subpixel pair SPP1 and the third subpixel pair SPP3 may be disposed adjacent to each other and disposed in the same row (i.e., the (n+1)-th row).

Further, FIG. 3 illustrates the structure where in which: the second light emitting area EA2 included in the first subpixel pair SPP1 is located over the third light emitting area EA3; the fourth light emitting area EA4 included in the second subpixel pair SPP2 is located over the fifth light emitting area EA5; and the sixth light emitting area EA6 included in the third subpixel pair SPP3 is located over the seventh light emitting area EA7, but embodiments of the present disclosure are not limited thereto.

For example, as shown in FIG. 5, the third light emitting area EA3 included in the first subpixel pair SPP1 may be located over the second light emitting area EA2, the fifth light emitting area EA5 included in the second subpixel pair SPP2 may be located over the fourth light emitting area EA4, and the seventh light emitting area EA7 included in the third subpixel pair SPP3 may be located over the sixth light emitting area EA6.

In this manner, any structure in which each subpixel pair includes light emitting areas configured to emit light of a respective complementary color pair can be applied to the display device according to aspects of the present disclosure.

As described above, since the first to third subpixel pairs (SPP1, SPP2, and SPP3) include the red, green, and blue light emitting areas, and include the cyan, magenta, and yellow light emitting areas, which are light emitting areas of the complementary colors of red, green, and blue, respectively, the expression of gray (or achromatic color) in the display area DA of the display panel 110 can be facilitated.

Further, since each of the first to third subpixel pairs (SPP1, SPP2, and SPP3) includes one of the red, green, and blue light emitting areas and one of the cyan, magenta, and yellow light emitting areas, the expression of gray (or achromatic color) in the display area DA of the display panel 110 can be facilitated without causing a reduction in resolution.

Further, the expression of basic colors (e.g., red, green, and blue) of the display panel 110 as well as achromatic colors can be facilitated through color combinations of light emitting areas included in the first subpixel SP1 and each of the first to third subpixel pairs (SPP1, SPP2, and SPP3).

With respect to FIGS. 3, 4, and 5, in the display area DA of the display panel 110 according to aspects of the present disclosure, at least one light emitting area among the second to seventh light emitting areas (EA2, EA3, EA4, EA5, EA6, and EA7) may be half the area of the first light emitting area EA1 included in the first subpixel SP1.

For example, as shown in FIGS. 3, 4, and 5, the area of each of the second to seventh light emitting areas (EA2, EA3, EA4, EA5, EA6, and EA7) may be half the area of the first light emitting area EA1.

The area of the first light emitting area EA1 may correspond to the area of one transmissive area TA.

For example, one transmissive area TA and the first light emitting area EA1 may occupy the same area, and the area of each of the second to seventh light emitting areas (EA2, EA3, EA4, EA5, EA6, and EA7) may correspond to half the area of each of one transmissive area TA and the first light emitting area EA1.

Through such a subpixel structure, while maintaining the transmittance of the display device 100, a respective area (size) of each light emitting area can be increased, thereby leading luminance to be improved. Thus, a lower portion of, or a portion under, a display panel can be easily recognized from the front of the display panel 110 since the transmittance of the display device 100 is not reduced, light emitting efficiency can be increased by the increased light emitting areas, and in turn, information recognition characteristics of the display device 100 can be improved.

With reference to FIGS. 3, 4, and 5, a plurality of data lines DL and a plurality of scan lines SCL may be disposed in the display panel 110, and at least one subpixel may share a scan line SCL or a data line DL with at least one other subpixel.

Such a structure is discussed with reference to FIG. 6.

Figure 6:
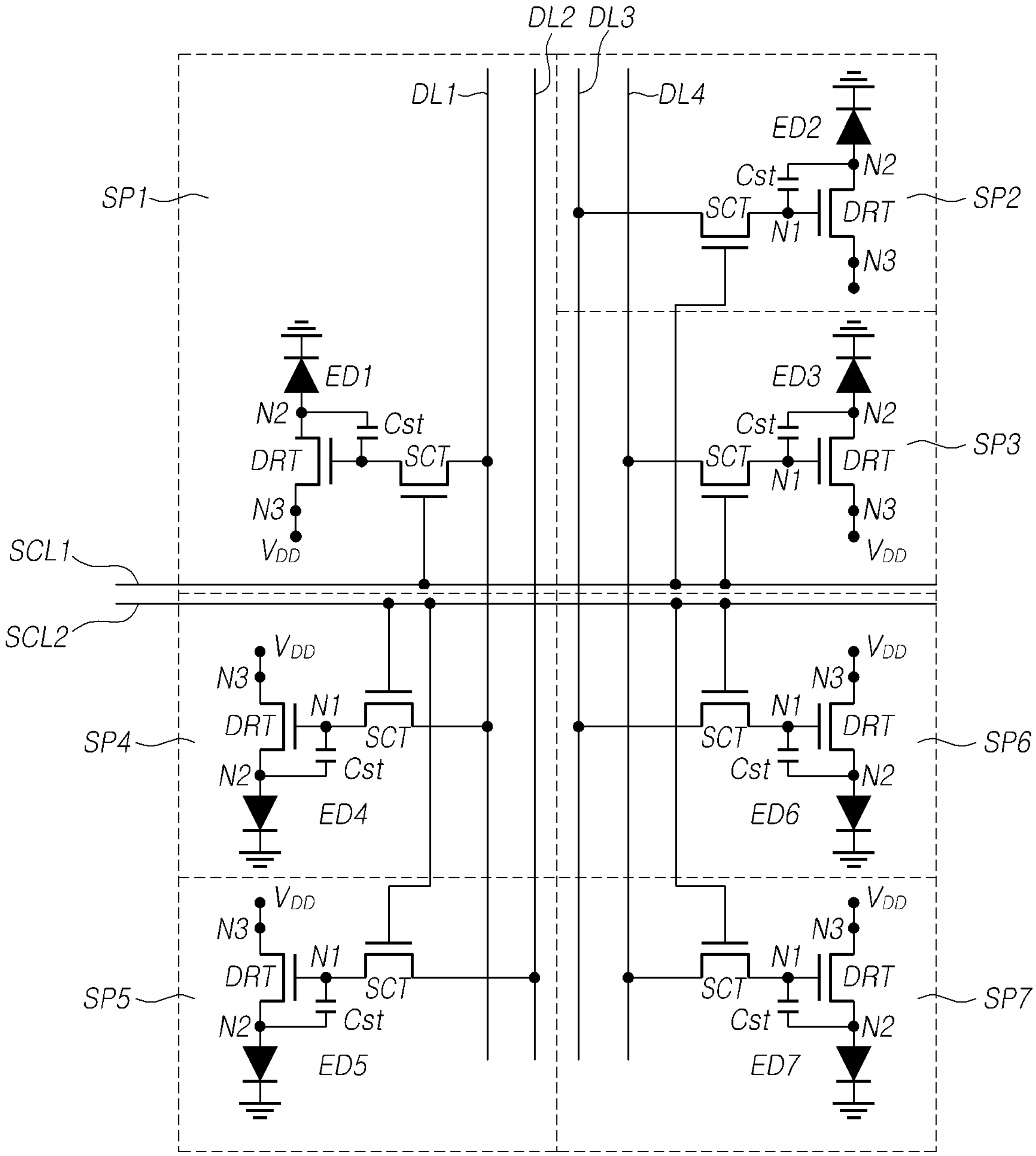
FIG. 6 illustrates example circuits of first to seventh subpixels in the display panel according to aspects of the present disclosure.

FIG. 6 illustrates example circuits of first to seventh subpixels in the display panel 110 according to aspects of the present disclosure.

FIG. 6 illustrates that one subpixel is configured with a 2T(transistor)-1C(capacitor) structure, but this is only an example for explanation. For example, as shown in FIG. 2, each subpixel may further include one or more transistors in the 2T-1C structure, or in some implementations, may further include one or more capacitors therein. In one or more embodiments, each of a plurality of subpixels may have the same structure, or one or more of the plurality of subpixels may have a different structure.

With reference to FIG. 6, at least one light emitting element ED may be disposed in each subpixel SP1, and transistors (DRT and SCT) and a storage capacitor Cst for driving the light emitting element ED may be disposed in the first subpixel SP1.

With reference to FIG. 6, at least two scan lines (e.g., first and second scan lines SCL1 and SCL2) and at least four data lines (e.g., first to fourth data lines DL1, DL2, DL3, and DL4) may be used to drive seven subpixels.

In one or more embodiments, respective circuits of at least two subpixels may share one scan line. In one or more embodiments, respective circuits of at least two subpixels may share one data line.

For example, with reference to FIG. 6, a circuit (e.g., elements needed to enable a corresponding light emitting element to emit light) of the first subpixel SP1 may be electrically connected to the first data line DL1 and the first scan line SCL1.

The second subpixel SP2 and the third subpixel SP3 may be disposed on one side of the first subpixel SP1.

A circuit of the second subpixel SP2 may be electrically connected to the third data line DL3 disposed on one side of the first data line DL1 and the first scan line SCL1.

A circuit of the third subpixel SP3 may be electrically connected to the fourth data line DL4 disposed on one side of the third data line DL3, and be electrically connected to the first scan line SCL1 to which the respective circuits of the first and second subpixels (SP1 and SP2) are electrically connected.

The fourth subpixel SP4 and the fifth subpixel SP5 may be disposed under the first subpixel SP1.

A circuit of the fourth subpixel SP4 may be electrically connected to the first data line DL1 to which the circuit of the first subpixel SP1 is electrically connected, and be electrically connected to the second scan line SCL2 adjacent to the first scan line SCL1.

A circuit of the fifth subpixel SP5 may be electrically connected to the second data line DL2 disposed between the first data line DL1 and the third data line DL3, and be electrically connected to the second scan line SCL2 to which the circuit of the fourth subpixel SP4 is electrically connected.

With reference to FIG. 6, the sixth and seventh subpixels (SP6 and SP7) may be disposed under the second and third subpixels (SP2 and SP3).

A circuit of the sixth subpixel SP6 may be electrically connected to the third data line DL3 (i.e., the data line disposed between the second data line DL2 and the fourth data line DL4) to which the circuit of the second subpixel SP2 is electrically connected, and be electrically connected to the second scan line SCL2 to which the respective circuits of the fourth and fifth subpixels (SP4 and SP5) are electrically connected.

A circuit of the seventh subpixel SP7 may be electrically connected to the fourth data line DL4 to which the circuit of the third subpixel SP3 is electrically connected, and be electrically connected to the second scan line SCL2 to which the respective circuits of the fourth, fifth, and sixth subpixels (SP4, SP5, and SP6) are electrically connected.

In this manner, the respective circuits of subpixels disposed in the same row may be electrically connected to the same scan line.

With reference to FIG. 6, the respective circuits of the first to third subpixels (SP1, SP2, and SP3) disposed in the n-th row may be connected to the first scan line SCL1, and the respective circuits of the fourth to seventh subpixels (SP4, SP5, SP6, and SP7) disposed in the (n+1)-th row may be connected to the second scan line SCL2.

At least two of the subpixels disposed in the same column may be electrically connected to the same data line.

With reference to FIG. 6, the respective circuits of the first and fourth subpixels (SP1 and SP4) disposed in the m-th column may be connected to the first data line DL1, the respective circuits of the second and sixth subpixels (SP2 and SP6) disposed in the (m+1)-th column may be connected to the third data line DL3, and the respective circuits of the third and seventh subpixels (SP3 and SP7) disposed in the (m+1)-th column may be connected to the fourth data line DL4.

With reference to FIG. 6, in one or more embodiments, the circuit configured to drive a first light emitting element ED1 disposed in a white light emitting area, and the circuit configured to drive a fourth light emitting element ED4 disposed in a green light emitting area may be connected to the same data line (i.e., the first data line DL1). In one or more embodiments, the circuit configured to drive a second light emitting element ED2 disposed in a red light emitting area, and the circuit configured to drive a sixth light emitting element ED6 disposed in a blue light emitting area may be connected to the same data line (i.e., the third data line DL3). In one or more embodiments, the circuit configured to drive a third light emitting element ED3 disposed in a cyan light emitting area and the circuit configured to drive a seventh light emitting element ED7 disposed in a yellow light emitting area may be connected to the same data line (i.e., the fourth data line DL4).

In this manner, since respective circuits of subpixels disposed in the same row are electrically connected to the same scan line and, at least two of subpixels disposed in the same column are electrically connected to the same data line, fewer signal lines can be formed when compared with the number of subpixels. Thereby, the process of manufacturing the display device 100 or the display panel 110 can be simplified, and the area (size) of an opaque area occupied by signal lines can be reduced.

By employing the configurations discussed above, the display device according to aspects of the present disclosure may have a structure in which data voltages are supplied at same scan timing to subpixels including light emitting areas of complementary color pairs among a plurality of subpixels.

With reference to FIGS. 3, 4, and 5, the discussions have been provided based on the example in which the area of the first light emitting area EA1 corresponds to the area of one transmissive region TA, and the area of each of the second to seventh light emitting areas (EA2, EA3, EA4, EA5, EA6, and EA7) is half of the area of the first light emitting area EA1.

For example, with reference to FIG. 3, the area of the first transmissive area TA1 and the area of the first light emitting area EA1 disposed in the n-th row and the m-th column may be formed in one-to-one (1:1) correspondence, and the area of the second transmissive area TA2 disposed in the n-th row and the (m+1)-th column and the sum of the areas of the light emitting areas (i.e., the second and third light emitting areas EA2 and EA3) disposed therein may be formed in one-to-one (1:1) correspondence.

With reference to FIG. 3, the area of the third transmissive area TA3 disposed in the (n+1)-th row and the m-th column and the sum of the areas of the light emitting areas (i.e., the fourth and fifth light emitting areas EA4 and EA5) disposed therein may be formed in one-to-one (1:1) correspondence, and the area of the fourth transmissive area TA4 disposed in the (n+1)-th row and the (m+1)-th column and the sum of the areas of the light emitting areas (i.e., the sixth and seventh light emitting areas EA6 and EA7) disposed therein may be formed in one-to-one (1:1) correspondence.

Since the display panel 110 according to aspects of the present disclosure has the pixel structure as described above, the display panel 110 can acquire a higher transmittance and improve luminance characteristics.

However, structures of the display panel 110 according to embodiments of the present disclosure are not limited thereto.

Figure 7:
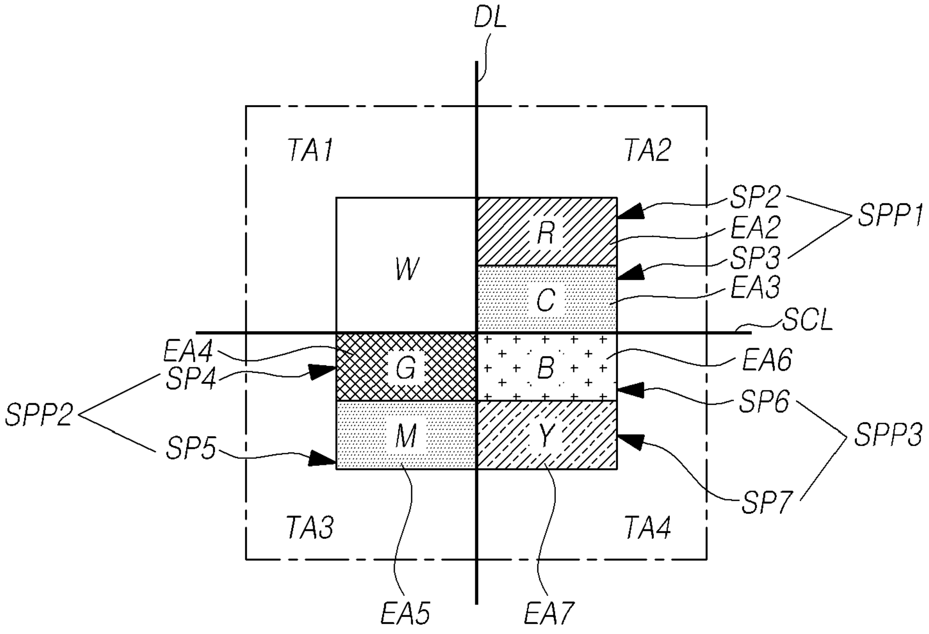
FIG. 7 schematically illustrates further another example structure in the display panel according to aspects of the present disclosure.

FIG. 7 illustrates still another example structure in the display panel 110 according to aspects of the present disclosure.

In one or more embodiments, with reference to FIG. 7, the area of a first transmissive area TA1 disposed in the n-th row and the m-th column may be greater than that of a first light emitting area EA1 disposed therein, and the area of a second transmissive area TA2 disposed in the n-th row and the (m+1)-th column may be greater than the sum of respective areas of light emitting areas (e.g., second and third light emitting areas EA2 and EA3) disposed therein.

With reference to FIG. 7, the area of a third transmissive area TA3 disposed in the (n+1)-th row and the m-th column may be greater than the sum of respective areas of light emitting areas (e.g., fourth and fifth light emitting areas EA4 and EA5) disposed therein, and the area of a fourth transmissive area TA4 disposed in the (n+1)-th row and the (m+1)-th column may be greater than the sum of the areas of light emitting areas (e.g., sixth and seventh light emitting areas EA6 and EA7) disposed therein, For example, the area of the first transmissive area TA1 may be 2 to 3 times greater than that of the first light emitting area EA1, and each of the remaining transmissive areas (TA2, TA3, and TA4) may also be 2 to 3 times greater than the sum of respective areas of other two light emitting areas. However, structures of the display panel 110 according to embodiments of the present disclosure are not limited thereto.

FIGS. 3 to 7 show the structures in which the first to fourth transmissive areas (TA1, TA2, TA3, and TA4) and the first to seventh subpixels (SP1, SP2, SP3, SP4, SP5, SP6, and SP7) are disposed are in the same plane, but structures of the display panel 110 according to embodiments of the present disclosure are not limited thereto.

Figure 8:
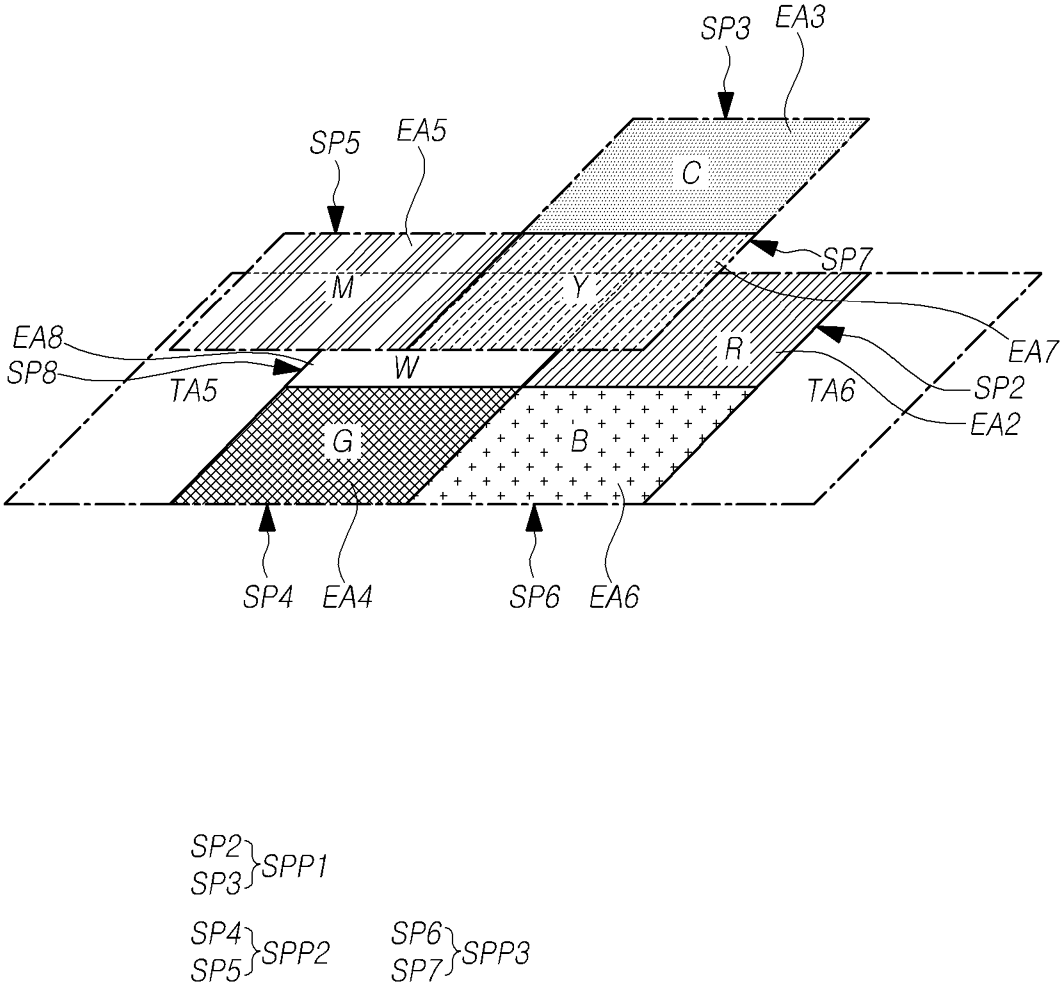
FIG. 8 illustrates still another example structure in the display panel according to aspects of the present disclosure.

FIG. 8 illustrates still another example structure in the display panel 110 according to aspects of the present disclosure.

With reference to FIG. 8, in one or more embodiments, the display panel 110 according to aspects of the present disclosure may include a first subpixel pair SPP1 including second and third subpixels (SP2 and SP3), a second subpixel pair SPP2 including fourth and fifth subpixels (SP4 and SP5), and a third subpixel pair SPP3 including sixth and seventh subpixels (SP6 and SP7). With reference to FIG. 8, an eighth subpixel SP8 may be disposed on one side of the second subpixel SP2 (or one side of the fourth subpixel SP4).

In FIG. 8, the eighth subpixel SP8 may include a light emitting area EA8 emitting white light.

With reference to FIG. 8, the third subpixel SP3 of the first subpixel pair SPP1 may be disposed over the second subpixel SP2 of the first subpixel pair SPP1. Accordingly, a structure in which a third light emitting area EA3 is disposed over a second light emitting area EA2 can be formed.

The fifth subpixel SP5 of the second subpixel pair SPP2 may be disposed over the fourth subpixel SP4 of the second subpixel pair SPP2. Accordingly, a structure in which a fifth light emitting area EA5 is disposed over a fourth light emitting area EA4 can be formed.

The seventh subpixel SP7 of the third subpixel pair SPP3 may be disposed over the sixth subpixel SP6 of the third subpixel pair SPP3. Accordingly, a structure in which a seventh light emitting area EA7 is disposed over a sixth light emitting area EA6 can be formed.

With reference to FIG. 8, in one or more embodiments, in the display panel 110 according to aspects of the present disclosure, the three subpixels (SP3, SP5, and SP7) may be disposed over the three subpixels (SP2, SP4, and SP6).

In FIG. 8, each of the three subpixels (SP2, SP4, and SP6) disposed under the three subpixels (SP3, SP5, and SP7) may include a red light emitting area EA2, a green light emitting area EA4, and a blue light emitting area EA6, respectively.

A cyan light emitting area EA3 configured to emit light of the complementary color of red may be disposed over the red light emitting area EA2 such that it overlaps the red light emitting area EA2. A magenta light emitting area EA5 configured to emit light of the complementary color of green may be disposed over the green light emitting area EA4 such that it overlaps the green light emitting area EA4. A yellow light emitting area EA7 configured to emit light of the complementary color of blue may be disposed over the blue light emitting area EA6 such that it overlaps the blue light emitting area EA6.

With reference to FIG. 8, a fifth transmissive area TA5 may be disposed on one side of the four subpixels (SP2, SP4, SP6, and SP8) disposed at lower respective locations than the three subpixels (SP3, SP5, and SP7), and a sixth transmissive area TA6 may be disposed on an opposing side of the four subpixels (SP2, SP4, SP6, and SP8).

For example, the four subpixels may be disposed between the fifth transmissive area TA5 and the sixth transmissive area TA6.

As shown in FIG. 8, by employing a structure in which light emitting areas configured to emit respective light of complementary color pairs are vertically stacked, the display device 100 configured to operate as a transparent display device can easily recognize information and recognize a lower portion of, or a portion under, the display panel.

However, structures of the display panel 110 according to embodiments of the present disclosure are not limited thereto.

For example, a ninth subpixel may be further disposed over the eighth subpixel SP8. The ninth subpixel disposed on the eighth subpixel SP8 may include a light emitting area emitting white light.

In one or more embodiments, a seventh transmissive area may be further disposed on one side of the three subpixels (SP3, SP5, and SP7), and an eighth transmissive area may be further disposed on an opposing side of the three subpixels (SP3, SP5, and SP7). For example, the seventh transmissive area may be disposed over the fifth transmissive area, and the eighth transmissive area may be disposed over the sixth transmissive area. In this example, at least three subpixels (SP3, SP5, and SP7) may be disposed between the two transmissive areas.

That is, the first subpixel SP1, and first, second, and third subpixel pairs (SPP1, SPP2, and SPP3), each of which includes a plurality of subpixels, may be disposed in the non-transmissive area of the display panel 110 according to aspects of the present disclosure. Each of the first to third subpixel pairs (SPP1, SPP2, and SPP3) may include two light emitting areas vertically stacked. The light emitting areas included in each of the first to third subpixel pairs (SPP1, SPP2, and SPP3) may be areas configured to emit respective light of complementary color pairs.

In one or more embodiments, in the display panel 110 according to aspects of the present disclosure, a transmissive area TA may be further disposed over the eighth subpixel SP8.

In this manner, the transmittance and light emitting areas of the display panel 110 may be adjusted according to design considerations by changing the arrangement and size of the transmissive areas and the plurality of subpixels.

Next, with reference to FIGS. 9, 10, and 11, a structure in which one subpixel pair is stacked in the display device 100 according to aspects of the present disclosure will be described.

Figure 9:
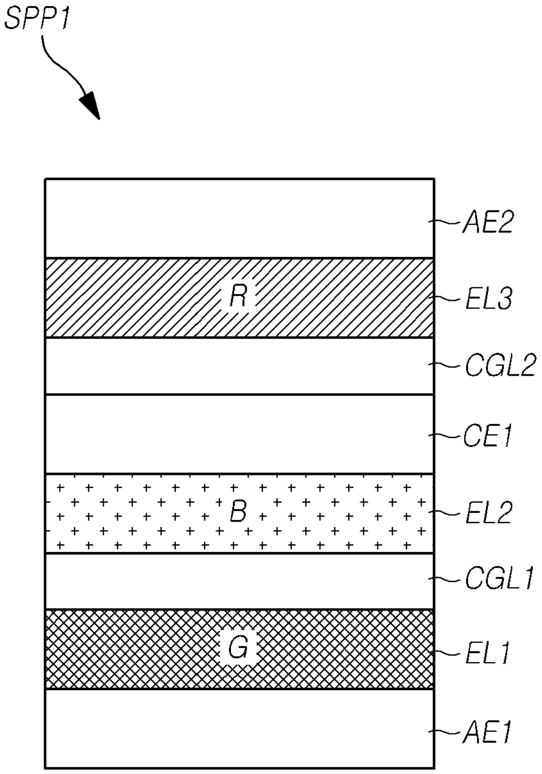
FIGS. 9 to 11 schematically illustrate respective structures of light emitting elements when the light emitting areas included in each subpixel pair are vertically stacked in the display device according to aspects of the present disclosure.
Figure 10:
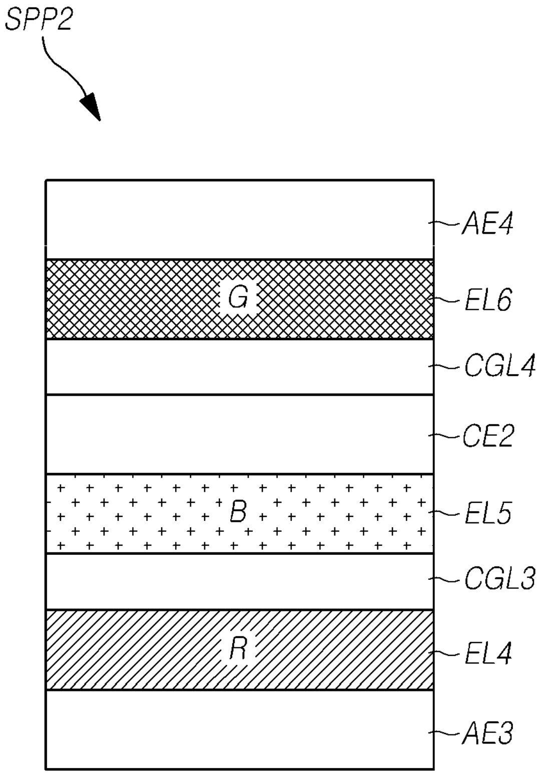
Figure 11:
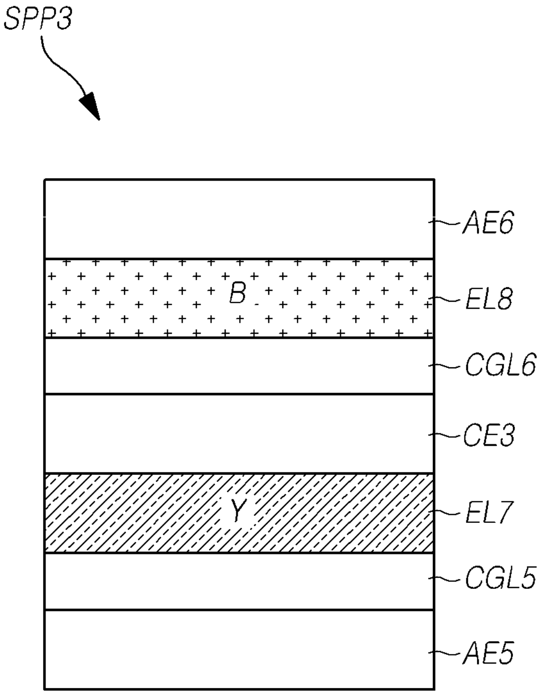

FIGS. 9, 10, and 11 schematically illustrate respective structures of light emitting elements when the light emitting areas included in each subpixel pair are vertically stacked in the display device 100 according to aspects of the present disclosure.

FIG. 9 illustrates a stacked structure of a first subpixel pair, FIG. 10 illustrates a stacked structure of a second subpixel pair, and FIG. 11 illustrates a stacked structure of a third subpixel pair.

With reference to FIGS. 9, 10, and 11, each subpixel pair (SPP1, SPP2, and SPP3) may include at least two anode electrodes AE, at least two emission layers EL, and one first cathode electrode CE1.

First, in FIG. 9, a red light emitting area and a cyan light emitting area may be vertically stacked in the first subpixel pair SPP1.

For example, light emitting elements disposed in the first subpixel pair SPP1 may be configured such that a first emission layer EL1 may be disposed on a first anode electrode AE1, a first charge generation layer CGL1 may be disposed on the first emission layer EL1, a second emission layer EL2 may be disposed on the first charge generation layer CGL1, and the first cathode electrode CE1 may be disposed on the second emission layer EL2. With reference to FIG. 9, a second charge generation layer CGL2 may be disposed on the first cathode electrode CE1, a third emission layer EL3 may be disposed on the second charge generation layer CGL2, and a second anode electrode AE2 may be disposed on the third emission layer EL3.

With reference to FIG. 9, light emitting elements disposed in the first subpixel pair SPP1 can operate based on two anode electrodes (AE1 and AE2) and one first cathode electrode CE1 disposed between the two anode electrodes (AE1 and AE2).

For example, the first subpixel pair SPP1 may include two light emitting elements. One of the two light emitting elements may include the first anode electrode AE1, the first and second emission layers (EL1 and EL2), and the first cathode electrode CE1, and the other thereof may include the first cathode electrode CE1, the third emission layer EL3, and the second anode electrode AE2.

For example, the first, second, and third emission layers (EL1, EL2, and EL3) of the first subpixel pair SPP1 may be green, blue, and red emission layers, respectively.

In the first subpixel pair SPP1, the first emission layer EL1 and the second emission layer EL2 may be disposed between the first anode electrode AE1 and the first cathode electrode CE1 to emit light, and the two emission layers may emit cyan light.

In the first subpixel pair SPP1, the third emission layer EL3 may be disposed between the first cathode electrode CE1 and the second anode electrode AE2 to emit light, and the third emission layer EL3 may emit red light.

With reference to FIG. 10, a green light emitting area and a magenta light emitting area may be vertically stacked in the second subpixel pair SPP2.

For example, light emitting elements disposed in the second subpixel pair SPP2 may be configured such that a fourth emission layer EL4 may be disposed on a third anode electrode AE3, a third charge generation layer CGL3 may be disposed on the fourth emission layer EL4, a fifth emission layer EL5 may be disposed on the third charge generation layer CGL3, and a second cathode electrode CE2 may be disposed on the fifth emission layer EL5. With reference to FIG. 10, a fourth charge generation layer CGL4 may be disposed on the second cathode electrode CE2, a sixth emission layer EL6 may be disposed on the fourth charge generation layer CGL4, and a fourth anode electrode AE4 may be disposed on the sixth emission layer EL6.

With reference to FIG. 10, light emitting elements disposed in the second subpixel pair SPP2 can operate based on two anode electrodes (AE3 and AE4) and one second cathode electrode CE2 disposed between the two anode electrodes (AE3 and AE4).

For example, the second subpixel pair SPP2 may include two light emitting elements. One of the two light emitting elements may include the third anode electrode AE3, the fourth and fifth emission layers (EL4 and EL5), and the second cathode electrode CE2, and the other thereof may include the second cathode electrode CE2, the sixth emission layer EL6, and the fourth anode electrode AE4.

For example, the fourth, fifth, and sixth emission layers (ELA, EL5, and EL6) of the second subpixel pair SPP2 may be red, blue, and green emission layers, respectively.

In the second subpixel pair SPP2, the fourth emission layer EL4 and the fifth emission layer EL5 may be disposed between the third anode electrode AE3 and the second cathode electrode CE2 to emit light, and the two emission layers may emit magenta light.

In the second subpixel pair SPP2, the sixth emission layer EL6 may be disposed between the second cathode electrode CE2 and the fourth anode electrode AE4 to emit light, and the sixth emission layer EL6 may emit green light.

With reference to FIG. 11, a blue light emitting area and a yellow light emitting area may be vertically stacked in the third subpixel pair SPP3.

For example, light emitting elements disposed in the third subpixel pair SPP3 may be configured such that a fifth charge generation layer CGL5 may be disposed on a fifth emission layer AE5, a seventh emission layer EL7 may be disposed on the fifth charge generation layer CGL5, and a third cathode electrode CE3 may be disposed on the seventh emission layer EL7. A sixth charge generation layer CGL6 may be disposed on the third cathode electrode CE3, an eighth emission layer EL8 may be disposed on the sixth charge generation layer CGL6, and a sixth anode electrode AE6 may be disposed on the eighth emission layer EL8.

With reference to FIG. 11, light emitting elements disposed in the third subpixel pair SPP3 can operate based on two anode electrodes (AE5 and AE6) and one third cathode electrode CE3 disposed between the two anode electrodes (AE5 and AE6).

For example, the third subpixel pair SPP3 may include two light emitting elements. One of the two light emitting elements may include the fifth anode electrode AE5, the seventh emission layers EL7, and the third cathode electrode CE3, and the other thereof may include the third cathode electrode CE3, the eighth emission layer EL8, and the sixth anode electrode AE6.

For example, the seventh and eighth emission layers (EL7 and EL8) of the third subpixel pair SPP3 may be yellow and blue emission layers, respectively.

In the third subpixel pair SPP3, the seventh emission layer EL7 may be disposed between the fifth anode electrode AE5 and the third cathode electrode CE3 to emit light, and the seventh emission layer EL7 may emit yellow light.

In the third subpixel pair SPP3, the eighth emission layer EL8 may be disposed between the third cathode electrode CE3 and the sixth anode electrode AE6 to emit light, and the eighth emission layer EL8 may emit blue light.

As shown in FIGS. 9, 10, and 11, the two light emitting areas included in each subpixel pair (SPP1, SPP2, SPP3) may be light emitting areas configured to emit light of a respective complementary color pair.

Meanwhile, although not shown in FIGS. 9, 10, and 11, the light emitting elements may be disposed in one display panel 110.

In this implementation, the first anode electrode AE1, the third anode electrode AE3, and the fifth anode electrode AE5 may be disposed in the same layer and include the same material. The first cathode electrode CE1, the second cathode electrode CE2, and the third cathode electrode CE3 may be disposed on the same layer and include the same material. The second anode electrode AE2, the fourth anode electrode AE4, and the sixth anode electrode AE6 may be disposed on the same layer and include the same material.

Figure 12:
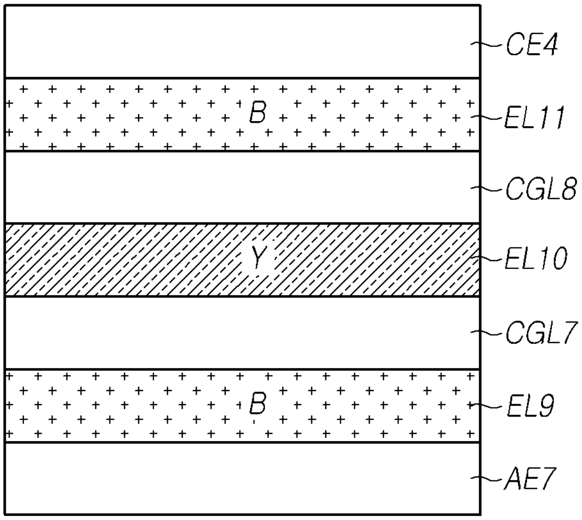
FIG. 12 schematically illustrates the structure of a light emitting element disposed in the eighth subpixel of FIG. 8.

FIG. 12 schematically illustrates the structure of a light emitting element disposed in the eighth subpixel of FIG. 8.

With reference to FIG. 12, a light emitting element emitting white light may be disposed in the eighth subpixel SP8.

In one or more embodiments, the light emitting element disposed in the eighth subpixel SP8 may include a seventh anode electrode AE7, a ninth emission layer EL9 disposed on the seventh anode electrode AE7, a seventh charge generation layer CGL7 disposed on the ninth emission layer EL9, a tenth emission layer EL10 disposed on the seventh charge generation layer CGL7, an eighth charge generation layer CGL8 disposed on the tenth emission layer EL10, an eleventh emission layer EL11 disposed on the eighth charge generation layer CGL8, and a fourth cathode electrode CE4 disposed on the eleventh emission layer EL11.

The ninth emission layer EL9 may be a blue emission layer, the tenth emission layer EL10 may be a yellow emission layer, and the eleventh emission layer EL11 may be a blue emission layer.

A light emitting element including the ninth to eleventh emission layers (EL9, EL10, and EL11) may emit white light.

Figure 13:
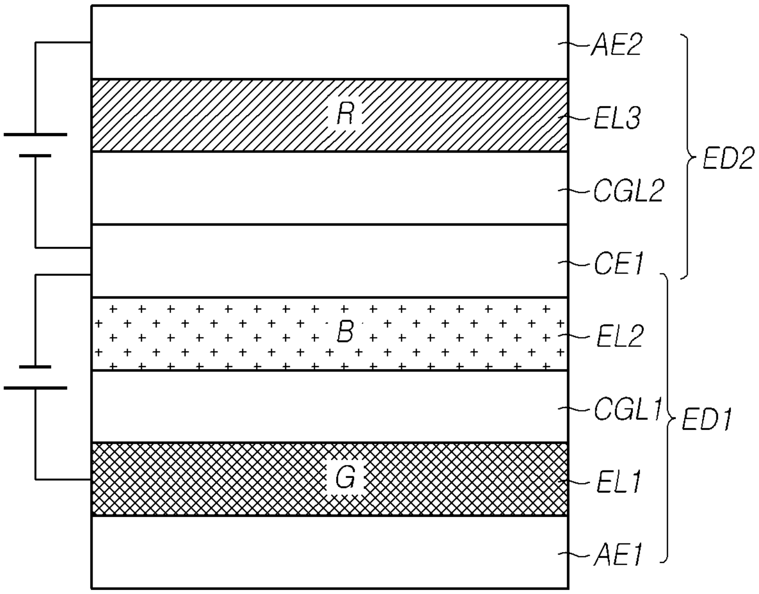
FIG. 13 schematically illustrates a state in which voltage is applied to the light emitting elements shown in FIG. 9.

FIG. 13 schematically illustrates a state in which voltage is applied to the light emitting elements shown in FIG. 9.

With reference to FIG. 13, the first subpixel pair SPP1 may include a first light emitting element ED1 and a second light emitting element ED2.

The first light emitting element ED1 and the second light emitting element ED2 may share one first cathode electrode CE1.

When a positive voltage is applied to each of the first anode electrode AE1 and the second anode electrode AE2, and a negative voltage is applied to the first cathode electrode CE1, the first and second light emitting elements (ED1 and ED2) can be driven.

According to the embodiments described above, since the first and second light emitting elements (ED1 and ED2) may be driven by a single cathode electrode, the structure of the display panel 110 can be simplified.

Although the example of FIG. 13 has been discussed based on the structure shown in FIG. 9, such discussions may be applied to the structures of FIGS. 10 and 11 substantially equally.

Figure 14:
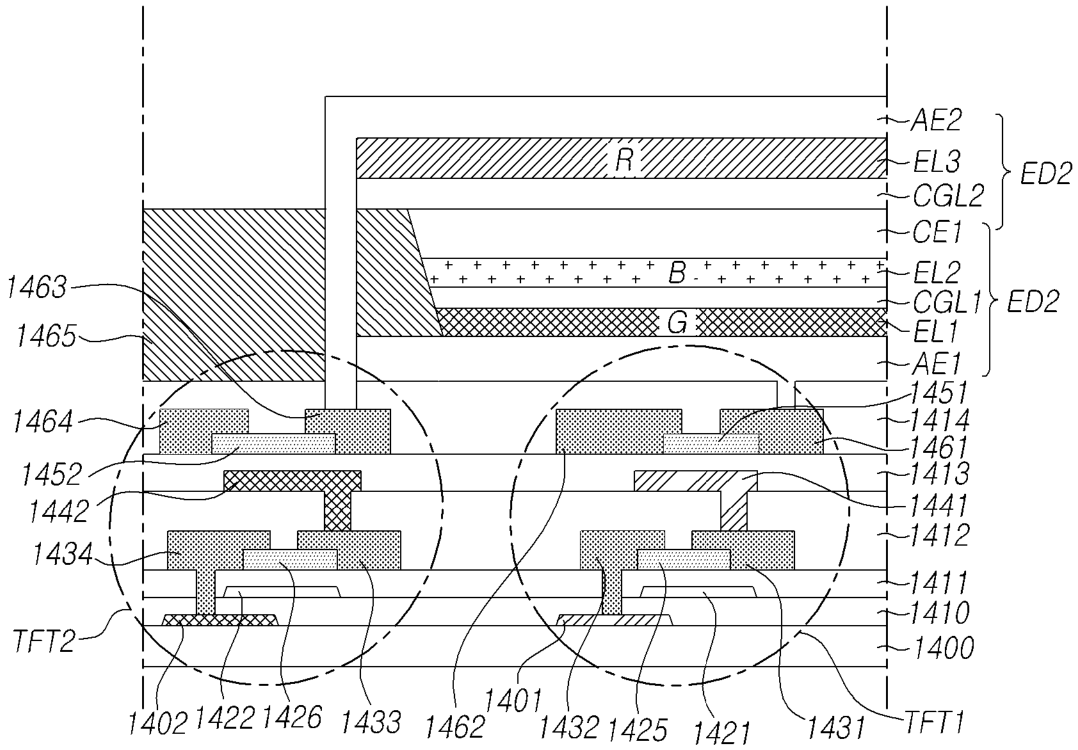
FIG. 14 schematically illustrates an example arrangement structure of light emitting elements included in a subpixel pair and transistors for driving the light emitting elements in the display device according to aspects of the present disclosure.

FIG. 14 schematically illustrates an example arrangement structure of light emitting elements included in a subpixel pair and transistors for driving the light emitting elements in the display device 100 according to aspects of the present disclosure.

With reference to FIG. 14, the display panel 110 according to aspects of the present disclosure may include a plurality of signal lines (1401 and 1402) disposed on a substrate 100.

A buffer layer 1410 may be disposed on the signal lines (1401 and 1402).

First and second transistors (TFT1 and TFT2) may be disposed on the buffer layer 1410.

The first transistor TFT1 may include a first gate electrode 1421, a first active layer 1425, a first electrode 1431, a second electrode 1432, a second gate electrode 1441, a second active layer 1451, a fifth electrode 1461, and a sixth electrode 1462.

The second transistor TFT2 may include a first gate electrode 1422, a first active layer 1426, a third electrode 1433, a fourth electrode 1434, a second gate electrode 1442, a second active layer 1452, a seventh electrode 1463, and an eighth electrode 1464.

However, structures of the first and second transistors (TFT1 and TFT2) according to the embodiments of the present disclosure are not limited thereto, and each of the first and second transistors (TFT1 and TFT2) may have a structure including only one gate electrode, one active layer, one source electrode, and one drain electrode.

The first gate electrodes (1421 and 1422) may be disposed on the buffer layer 1410.

A first gate insulating layer 1411 may be disposed on the first gate electrodes (1421 and 1422).

The first active layers (1425 and 1426) may be disposed on the first gate insulating layer 1411.

The first to fourth electrodes (1431, 1432, 1433, and 1434) may be disposed on the first active layers (1425 and 1426).

For example, with reference to FIG. 14, the first electrode 1431 and the second electrode 1432 may be spaced apart from each other and be electrically connected to the top surface of one first active layer 1425.

The third electrode 1433 and the fourth electrode 1434 may be spaced apart from each other and be electrically connected to the top surface of another first active layer 1426.

For example, as shown in FIG. 14, each of the first and second electrodes (1431 and 1432) may contact a portion of the top surface of the first active layer 1425, and each of the third and fourth electrodes (1433 and 1434) may contact a portion of the top surface of the first active layer 1426.

The first and second electrodes (1431 and 1432) may be the source and drain electrodes of one transistor, and the third and fourth electrodes (1433 and 1434) may be the source and drain electrodes of another transistor.

With reference to FIG. 14, a first insulating layer 1412 may be disposed over the substrate 1400 over which the first to fourth electrodes (1431, 1432, 1433, and 1434) are disposed.

The second gate electrodes (1441 and 1442) may be disposed on the first insulating layer 1412.

With reference to FIG. 14, one second gate electrode 1441 may be electrically connected to the first electrode 1431, and another second gate electrode 1442 may be electrically connected to the third electrode 1433.

A second insulating layer 1413 may be disposed on the second gate electrodes (1441 and 1442).

The second active layers (1451 and 1452) may be disposed on the second insulating layer 1413.

With reference to FIG. 14, the fifth to eighth electrodes (1461, 1462, 1463, and 1464) may be disposed on the second active layers (1451 and 1452).

For example, with reference to FIG. 14, each of the fifth electrode 1461 and the sixth electrode 1462 may be spaced apart from each other and be electrically connected to the top surface of one second active layer 1451.

The seventh electrode 1463 and the eighth electrode 1464 may be spaced apart from each other and be electrically connected to the top surface of another second active layer 1452.

For example, as shown in FIG. 14, each of the fifth and sixth electrodes (1461 and 1462) may contact a portion of the top surface of the second active layer 1451, and each of the seventh and eighth electrodes (1463 and 1464) may contact a portion of the top surface of the second active layer 1452.

With reference to FIG. 14, the first gate electrode 1421, the first active layer 1425, the second gate electrode 1441, and the second active layer 1451 may overlap each other, and the first gate electrode 1422, the first active layer 1426, the second gate electrode 1442, and the second active layer 1452 may overlap each other.

A third insulating layer 1414 may be disposed over the substrate 1400 over which the fifth to eighth electrodes (1461, 1462, 1463, and 1464) are disposed.

With reference to FIG. 14, a first anode electrode AE1 may be disposed on the third insulating layer 1414.

A bank 1465 may be disposed on a portion of the top surface of the first anode electrode AE1 and on the third insulating layer 1414.

A first emission layer EL1, a first charge generation layer CGL1, a second emission layer EL2, and a first cathode electrode CE1 may be sequentially disposed on the first anode electrode AE1 not overlapping the bank 1465. A first light emitting element ED1 may include the first anode electrode AE1, the first emission layer EL1, the first charge generation layer CGL1, the second emission layer EL2, and the first cathode electrode CE1.

With reference to FIG. 14, a second charge generation layer CGL2, a third emission layer EL3, and a second anode electrode AE2 may be sequentially disposed on the first cathode electrode CE1. A second light emitting element ED2 may include the first cathode electrode CE1, the second charge generation layer CGL2, the third emission layer EL3, and the second anode electrode AE2.

With reference to FIG. 14, the second anode electrode AE2 may be electrically connected to the seventh electrode 1463.

For example, the second anode electrode AE2 may contact the seventh electrode 1463 through contact holes formed in the bank 1465 and the third insulating layer 1414, but structures of the second anode electrode AE2 according to embodiments of the present disclosure are not limited thereto.

In this manner, since each of the first and second transistors (TFT1 and TFT2) has a structure in which two active layers and two gate electrodes are stacked, the degree of integration can be improved and interference between components can be minimized or reduced.

With reference to FIG. 14, the first light emitting element ED1 may be electrically connected to the fifth electrode 1461 included in the first transistor TFT1, and the second light emitting element ED2 may be electrically connected to the seventh electrode 1463 included in the second transistor TFT2.

The structure in which the first light emitting element ED1 and the second light emitting element ED2 shown in FIG. 14 are connected to the first transistor TFT1 and the second transistor TFT2 may also be applied to the light emitting elements shown in FIGS. 9, 10, and 11 substantially equally. For example, the vertically stacked light emitting elements shown in FIGS. 9, 10, and 11 may be electrically connected to different transistors disposed over the substrate 1400.

In this manner, the anode electrodes of the two light emitting elements sharing one cathode electrode may be connected to different transistors to receive signals.

Figure 15:
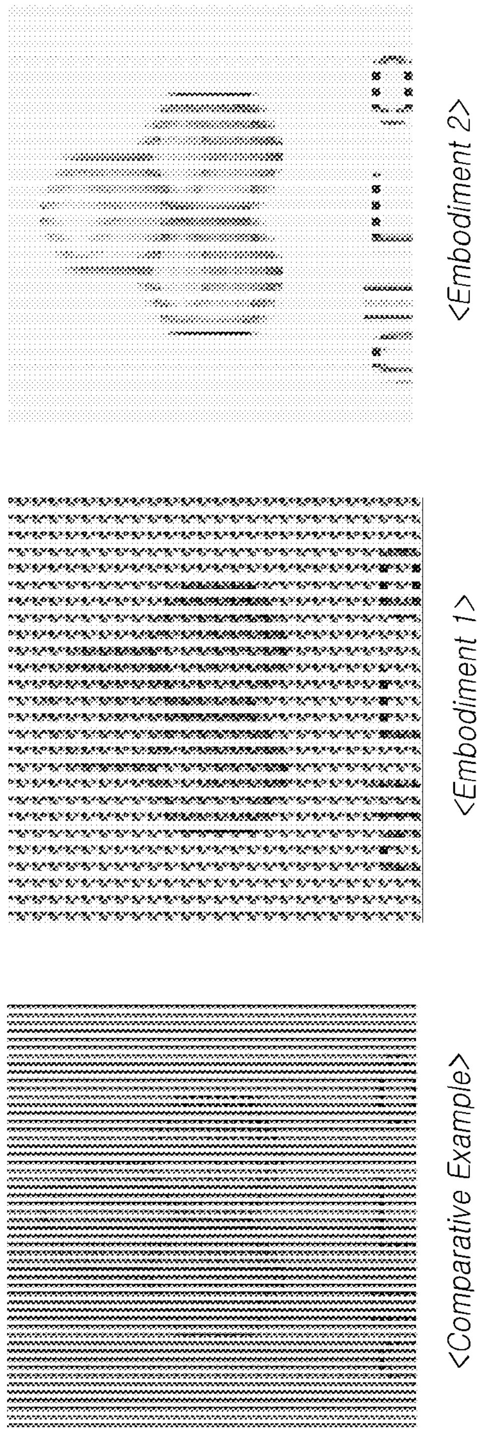
FIG. 15 illustrates images in the display panel according to embodiments of the present disclosure and an image in a display panel according to a comparative example.

FIG. 15 illustrates images in the display panel 110 according to embodiments of the present disclosure and an image in a display panel according to a comparative example. The images of FIG. 15 are images obtained by magnifying 100 times actual images in a plurality of subpixel areas and a plurality of transmissive areas for convenience of comparison of image conditions.

In FIG. 15, the display panel based on Comparative Example may have a structure in which three or more light emitting areas are disposed on one side of one transmissive area.

Embodiment 1 may be an image produced based on the example where the display panel 110 has the pixel structure shown in FIG. 3, and Embodiment 2 may be an image produced based on the example where the display panel 110 has the pixel structure shown in FIG. 8.

As shown in FIG. 15, it can be seen that the images produced based on Embodiments 1 and 2 are clearer than the image produced by the display panel based on the Comparative Example.

In addition, it can be seen that the transmittance of the display panel 110 based on Embodiments 1 and 2 is higher than that of the display panel based on the Comparative Example. As a result, a lower portion of, or a portion under, the display panel 110 based on Embodiments 1 and 2 can be easily recognized from the front of the display panel 110.

According to the embodiments described herein, the display panel 110 and the display device 100 may be provided that, since each light emitting area is designed to have a wide area in the display panel including a transparent area, enable high luminance to be implemented even under low current density, and thereby, enable the lifespan of the light emitting element to be extended, and in turn, are capable of operating with low power.

According to the embodiments described herein, the display panel 110 and the display device 100 may be provided that are capable of preventing resolution reduction while facilitating expression of an achromatic color by employing a structure in which each of a plurality of subpixel pairs includes respective light emitting areas configured to emit light of a complementary color pair.

According to the embodiments described herein, the display panel 110 and the display device 100 may be provided that include a structure in which one transmissive area has an area corresponding to one subpixel or two subpixels, and thereby, are capable of improving transmittance, and facilitating recognition of a lower portion of, or a portion under, the display panel from the front of the display panel.

According to the embodiments described herein, the display panel 110 and the display device 100 may be provided that include a structure in which respective circuits of subpixels disposed in the same row are electrically connected to a same scan line, and at least two of subpixels disposed in the same column are electrically connected to a same data line, and thereby, are capable of simplifying a corresponding manufacturing process and reducing an opaque area occupied by a plurality of signal lines.

The above description has been presented to enable any person skilled in the art to make, use and practice the technical features of the present disclosure, and has been provided in the context of a particular application and its requirements as examples. Various modifications, additions and substitutions to the described embodiments will be readily apparent to those skilled in the art, and the principles described herein may be applied to other embodiments and applications without departing from the scope of the present disclosure. The above description and the accompanying drawings provide examples of the technical features of the present disclosure for illustrative purposes only. That is, the disclosed embodiments are intended to illustrate the scope of the technical features of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

at least one transmissive area; and a non-transmissive area disposed on at least one side of the at least one transmissive area, wherein:

the non-transmissive area includes a first subpixel pair, a second subpixel pair, and a third subpixel pair;

each of the first subpixel pair, the second subpixel pair and the third subpixel pair includes a plurality of subpixels having a complementary color relationship, and data voltages are supplied to the plurality of subpixels having the complementary color relationship at a same scan timing;

the non-transmissive area includes first to seventh light emitting areas;

the second light emitting area and the third light emitting area have a complementary color relationship, the fourth light emitting area and the fifth light emitting area have a complementary color relationship, and the sixth light emitting area and the seventh light emitting area have a complementary color relationship;

an area of the first light emitting area corresponds to an area of one transmissive area disposed on one side of the first light emitting area; and the area of the first light emitting area is greater than an area of each of the second to seventh light emitting areas.

2. The display device of claim 1, wherein the at least one transmissive area comprises:

a first transmissive area disposed on one side of the first subpixel;

a second transmissive area disposed on one side of the first subpixel pair;

a third transmissive area disposed on one side of the second subpixel pair; and a fourth transmissive area disposed on one side of the third subpixel pair.

3. The display device of claim 1, wherein each of the first, second, and third subpixel pairs comprises light emitting areas of different colors, and comprises one light emitting area among red, green, and blue light emitting areas and one light emitting area among cyan, magenta, and yellow light emitting areas.

4. The display device of claim 1, wherein the area of the first light emitting area is less than an area of one transmissive area disposed on one side of the first light emitting area, and the area of the first light emitting area is greater than an area of each of second, third, fourth, fifth, sixth and seventh light emitting areas.

5. The display device of claim 1, wherein the area of the first light emitting area is less than an area of one transmissive area disposed on one side of the first light emitting area, and wherein respective areas of second, third, fourth, fifth, sixth and seventh light emitting areas are the same as each other.

6. The display device of claim 2, wherein:

the first subpixel pair comprises a second subpixel and a third subpixel arranged in a column direction;

the second subpixel pair comprises a fourth subpixel and a fifth subpixel arranged in the column direction;

the third subpixel pair comprises a sixth subpixel and a seventh subpixel arranged in the column direction, and wherein:

the second transmissive area is disposed on one side of the second and third subpixels;

the third transmissive area is disposed on one side of the fourth and fifth subpixels; and the fourth transmissive area is disposed on one side of the sixth and seventh subpixels.

7. The display device of claim 6, further comprising: a plurality of data lines and a plurality of scan lines disposed over a substrate of the display device;

wherein respective circuits of subpixels disposed in a same row are electrically connected to a same scan line, and at least two of subpixels disposed in a same column are electrically connected to a same data line.

8. The display device of claim 7, wherein the plurality of data lines comprises a first data line, a second data line, a third data line and a fourth data line extending in a column direction over the substrate of the display device, and the plurality of scan lines comprises a first scan line and a second scan line overlapping the first, second, third and fourth data lines and extending in a row direction.

9. The display device of claim 8, wherein:

a circuit of the first subpixel and a circuit of the fourth subpixel are electrically connected to the first data line;

a circuit of the fifth subpixel is electrically connected to the second data line;

circuits of the second and sixth subpixels are electrically connected to the third data line; and circuits of the third and seventh subpixels are electrically connected to the fourth data line.

10. The display device of claim 8, wherein a circuit of the first subpixel and circuits of the second and third subpixels are electrically connected to the first scan line, and circuits of the fourth, fifth, sixth and seventh subpixels are electrically connected to the second scan line.

11. A display panel comprising:

at least one transmissive area; and a non-transmissive area disposed on at least one side of the at least one transmissive area, wherein the non-transmissive area includes a first subpixel disposed between at least two transmissive areas among the at least one transmissive area, and first, second and third subpixel pairs, each of the first, second, and third subpixel pairs which include a plurality of subpixels, and wherein each of the first, second and third subpixel pairs includes two light emitting areas vertically stacked, and the two light emitting areas included in each of the first, second and third subpixel pairs are areas configured to emit respective light of complementary color pairs.

12. The display panel of claim 11, wherein a first light emitting area included in the first subpixel is a white light emitting area, and wherein each of the first, second, and third subpixel pairs comprises the light emitting areas of different colors, and comprises one light emitting area among red, green and blue light emitting areas and one light emitting area among cyan, magenta and yellow light emitting areas.

13. The display panel of claim 11, wherein:

the first subpixel pair comprises a second subpixel including a second light emitting area and third subpixel including a third light emitting area;

the second subpixel pair comprises a fourth subpixel including a fourth light emitting area and a fifth subpixel including a fifth light emitting area; and the third subpixel pair comprises a sixth subpixel including a sixth light emitting area and a seventh subpixel including a seventh light emitting area.

14. The display panel of claim 13, wherein:

each of the first subpixel comprising a white light emitting area and the fourth subpixel comprising a green light emitting area is electrically connected to a first data line;

the fifth subpixel comprising a magenta light emitting area is electrically connected to a second data line;

each of the second subpixel comprising a red light emitting area and the sixth subpixel comprising a blue light emitting area is electrically connected to a third data line; and each of the third subpixel comprising a cyan light emitting area and the seventh subpixel comprising a yellow light emitting area is electrically connected to a fourth data line.

15. The display panel of claim 13, wherein each of the first, second and third subpixel pairs comprises a first light emitting element and a second light emitting element disposed on the first light emitting element.

16. The display panel of claim 15, wherein the first light emitting element and the second light emitting element are driven separately.

17. The display panel of claim 15, wherein the first light emitting element comprises a first anode electrode, at least one first emission layer disposed on the first anode electrode, and a cathode electrode disposed on the first emission layer, and wherein the second light emitting element comprises at least one second emission layer disposed on the cathode electrode and a second anode electrode disposed on the second emission layer.

18. The display panel of claim 17, wherein the first light emitting element and the second light emitting element share the cathode electrode.

19. A display device comprising:

at least one transmissive area; and a non-transmissive area disposed on at least one side of the at least one transmissive area, wherein the non-transmissive area includes a first subpixel, a first subpixel pair, a second subpixel pair, and a third subpixel pair, and wherein each of the first subpixel pair, the second subpixel pair and the third subpixel pair includes a plurality of light emitting areas which are configured to emit light of complementary color pairs, and wherein data voltages are supplied to the plurality of light emitting areas at a same scan timing.

20. The display device of claim 19, wherein the at least one transmissive area comprises:

a first transmissive area disposed on one side of the first subpixel;

a second transmissive area disposed on one side of the first subpixel pair;

a third transmissive area disposed on one side of the second subpixel pair; and a fourth transmissive area disposed on one side of the third subpixel pair.

21. The display device of claim 20, wherein:

the first subpixel pair comprises a second subpixel and a third subpixel arranged in a column direction;

the second subpixel pair comprises a fourth subpixel and a fifth subpixel arranged in the column direction; and the third subpixel pair comprises a sixth subpixel and a seventh subpixel arranged in the column direction.

* * * * *